(12) United States Patent
Anderson et al.

(10) Patent No.: US 7,012,316 B1
(45) Date of Patent: Mar. 14, 2006

(54) ISOLATION STRUCTURES IN SEMICONDUCTOR INTEGRATED CIRCUITS (IC)

(75) Inventors: Brent A. Anderson, Jericho, VT (US); John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,425

(22) Filed: Sep. 17, 2004

(51) Int. Cl.
*H01L 29/00* (2006.01)

(52) U.S. Cl. ...................... 257/506; 438/221
(58) Field of Classification Search ......... 257/506, 257/522, 501, 507, 510, 513, 524; 438/221, 438/296, 219, 207, 218, 294, 427, 353, 295, 438/355, 404
See application file for complete search history.

(56) References Cited

U.S. PATENT DOCUMENTS

| | | |
|---|---|---|
| 5,229,305 A | 7/1993 | Baker |
| 5,770,504 A | 6/1998 | Brown et al. |
| 6,127,241 A * | 10/2000 | Rha ............................ 438/437 |
| 6,127,242 A | 10/2000 | Batra et al. |
| 6,268,637 B1 * | 7/2001 | Gardner et al. .............. 257/522 |
| 6,284,660 B1 | 9/2001 | Doan |
| 6,583,488 B1 * | 6/2003 | Xiang .......................... 257/506 |
| 6,686,255 B1 | 2/2004 | Yang et al. |
| 6,737,723 B1 * | 5/2004 | Farrar ......................... 257/510 |
| 2002/0197836 A1 | 12/2002 | Iyler et al. |

FOREIGN PATENT DOCUMENTS

| | | |
|---|---|---|
| DE | 19919406 A1 | 12/1999 |
| JP | 9017779 A | 1/1997 |

\* cited by examiner

*Primary Examiner*—Douglas W Owens
(74) *Attorney, Agent, or Firm*—Schmeiser, Olsen & Watts; William D. Sabo

(57) ABSTRACT

A novel isolation structure in semiconductor integrated circuits (IC) and the fabrication method of the same. The isolation structure comprises (a) semiconductor a substrate, and (b) an electric isolation region embedded in and at top of the semiconductor substrate, wherein the electric isolation region comprises (i) a bubble-implanted semiconductor region and (ii) an electrically insulating cap region on top of the bubble-implanted semiconductor region.

20 Claims, 2 Drawing Sheets

ISOLATION STRUCTURES IN SEMICONDUCTOR INTEGRATED CIRCUITS (IC)

BACKGROUND OF THE INVENTION

1. Technical Field

The present invention relates to semiconductor integrated circuits (IC), and more particularly, to isolation structures in semiconductor integrated circuits.

2. Related Art

Typical isolation structures such as STI (Shallow Trench Isolation) structures, field oxide regions, etc., are used in a semiconductor integrated circuit (IC) to electrically isolate different devices (e.g., transistors, resistors, capacitors, etc.) formed on a same semiconductor substrate. The fabrication of such typical isolation structures involve multiple fabrication steps which can substantially add to the fabrication cost of the IC.

Therefore, there is a need for a novel isolation structure (and the method of forming the same) that requires simpler and fewer fabrication steps than that of the prior art.

SUMMARY OF THE INVENTION

The present invention provides an isolation structure, comprising (a) a semiconductor substrate; and (b) an electric isolation region embedded in the semiconductor substrate, wherein the electric isolation region comprises (i) a bubble-implanted semiconductor region and (ii) an electrically insulating cap region on top of the bubble-implanted semiconductor region.

The present invention also provides a method for forming an isolation structure, the method comprising the steps of (a) providing a semiconductor substrate; (b) implanting gas bubbles into a semiconductor region of the substrate so as to form a bubble-implanted semiconductor region in the substrate; and (c) forming an electrically insulating cap region on top of the bubble-implanted semiconductor region.

The present invention also provides a method for forming an isolation structure, the method comprising the steps of (a) providing a semiconductor substrate; (b) forming a hard mask layer on top of the semiconductor substrate; (c) creating an opening in the hard mask layer such that a top surface of the substrate is exposed to the atmosphere via the opening; (d) etching into the substrate via the opening; (e) implanting gas bubbles into a semiconductor region of the substrate via the opening so as to form a bubble-implanted semiconductor region in the substrate; and (f) forming an electrically insulating cap region on top of the bubble-implanted semiconductor region such that a top surface of the electrically insulating cap region is essentially at a same level as a top surface of the substrate.

The present invention provides a novel isolation structure (and the method of forming the same) that requires simpler and fewer fabrication steps than that of the prior art.

DETAILED DESCRIPTION OF THE INVENTION

Figure 1A:
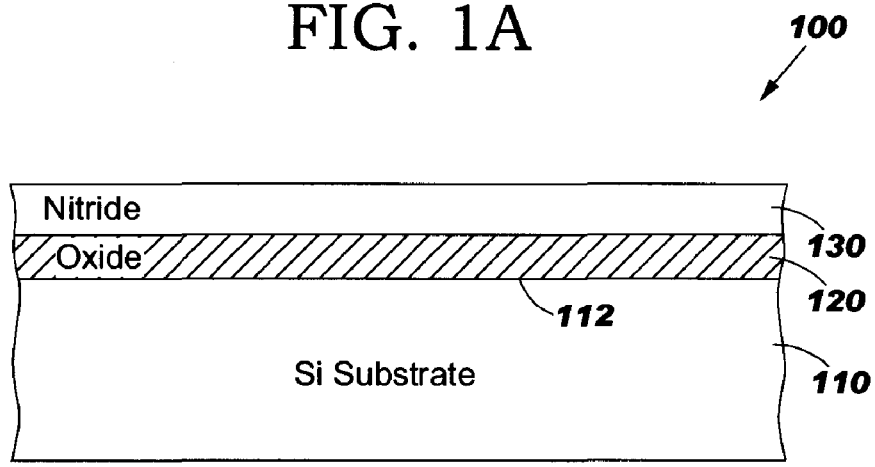
FIGS. 1A–1F show cross-section views of an isolation structure going through different fabrication steps, in accordance with embodiments of the present invention.

FIGS. 1A–1F show cross-section views of an isolation structure 100 going through different fabrication steps, in accordance with embodiments of the present invention. More specifically, with reference to FIG. 1A, in one embodiment, the fabrication process of the isolation structure 100 starts with the step of providing a semiconductor (silicon, germanium, etc.) substrate 110. Next, a pad oxide layer 120 is formed on top of the substrate 110. In one embodiment, the pad oxide layer 120 can be formed by thermally oxidizing a top surface 112 of the substrate 110.

Next, a nitride layer 130 is formed on top of the pad oxide layer 120. In one embodiment, the nitride layer 130 can be formed by CVD (Chemical Vapor Deposition) of silicon nitride on top of the pad oxide layer 120. The pad oxide layer 120 and the nitride layer 130 can be collectively referred to as the hard mask layer 120,130.

Figure 1B:
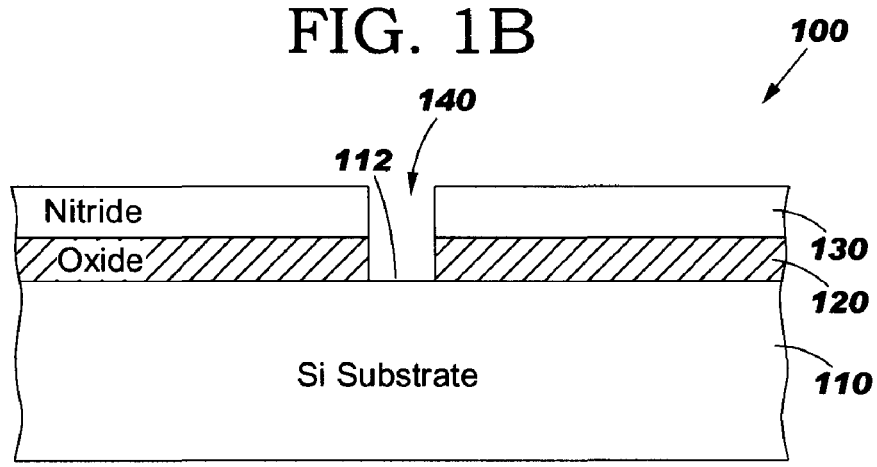

Next, with reference to FIG. 1B, in one embodiment, an opening 140 is created in the hard mask layer 120,130 by, illustratively, etching through the hard mask layer 120,130 until the top surface 112 of the substrate 110 is exposed to the atmosphere. In one embodiment, the step of etching through the hard mask layer 120,130 to form the opening 140 can involve photo-lithography and then dry etching.

Figure 1C:
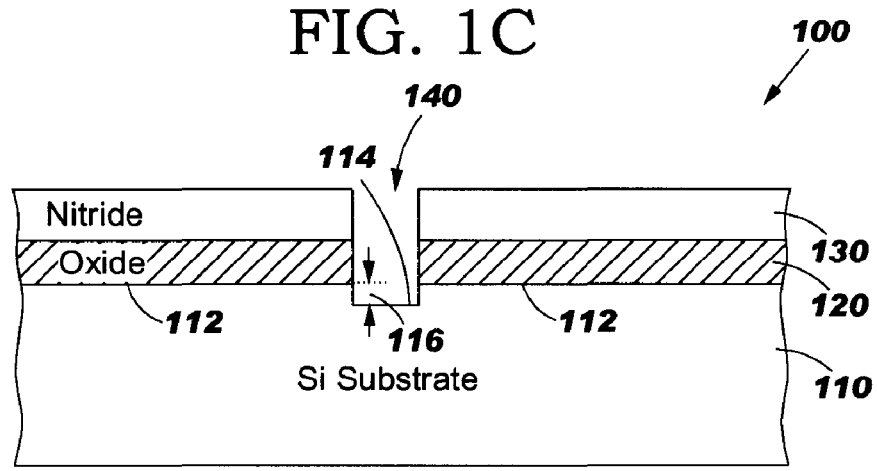

Next, with reference to FIG. 1C, in one embodiment, the fabrication process of the isolation structure 100 further comprises the step of etching down into the substrate 110 to a surface 114. In one embodiment, the hard mask layer 120,130 can be used as a mask for the step of etching down into the substrate 110 via the opening 140. In one embodiment, the step of etching down into the substrate 110 via the opening 140 can involve dry etching. In one embodiment, the depth 116 of this surface 114 (with respect to the top surface 112 of the substrate 110) is such that an electrically insulating cap region 160 (FIG. 1E) which is later formed to a pre-specified thickness will have a top surface 162 at the same level as the top surface 112 of the substrate 110 as discussed infra.

Figure 1D:
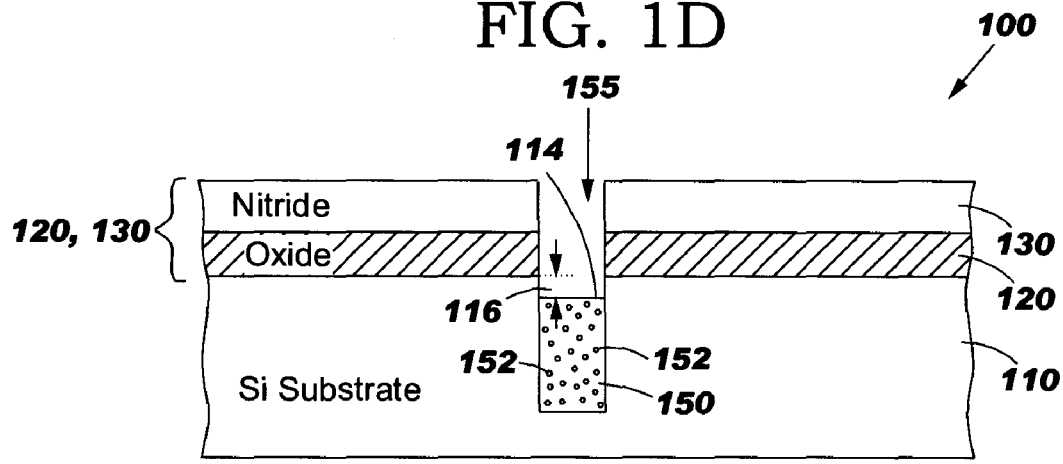

Next, with reference to FIG. 1D, in one embodiment, a bubble-implanted semiconductor region 150 is formed in the substrate 110. In one embodiment, the bubble-implanted semiconductor region 150 can be formed in a gas implanting step (represented by an arrow 155, and hereafter referred to as the gas implanting step 155). In one embodiment, the gas implanting step 155 implants gas bubbles 152 into a region 150 of the substrate 110 so as to form the bubble-implanted semiconductor region 150. In one embodiment, the implanting gas used in the gas implanting step 155 can comprise a noble gas such as Argon, Xenon, etc. As a result, the gas bubbles 152 in the bubble-implanted semiconductor region 150 comprise the noble gas. The bubble-implanted semiconductor region 150 with the noble gas bubbles 152 would behave like a low-K material, wherein K is a dielectric constant. In one embodiment, the substrate 110 can comprise silicon. As a result, the bubble-implanted semiconductor region 150 comprises gas bubbles 152 surrounded by a silicon material.

In one embodiment, the gas implant step can have a range of implants rate of $5 \times 10^{13} - 5 \times 10^{17}$ atoms/cm$^2$ for different bubble sizes. In one embodiment, the implanting gas can comprise He, Ar, Ne, Xe, and/or H.

In one embodiment, range of implant energies depends upon the desired depth of the electric isolation region 150,160 (FIG. 1E) and the mass of the implant used. Typical ranges include 5 keV–30 keV for a material like He, but very shallow depths for the electric isolation region 150,160 (FIG. 1E) may require low energies like 100 eV. In contrast, very deep depths for the electric isolation region 150,160 (FIG. 1E) may require high energies like 50 keV. In one embodiment, an application may require a combination of low and high energies to cover shallow to deep depths for the electric isolation region 150,160 (FIG. 1E), respectively.

Next, in one embodiment, the structure 100 can be subjected to a heat cycle which causes the implanted gas bubbles 152 to merge and form larger gas bubbles 152. The heat cycle can be performed such that the average size of the resulting implanted gas bubbles 152 will reach a pre-specified average size after this heat cycle and other ensuing heat fabrication steps (e.g., thermal oxide heat cycles).

Figure 1E:
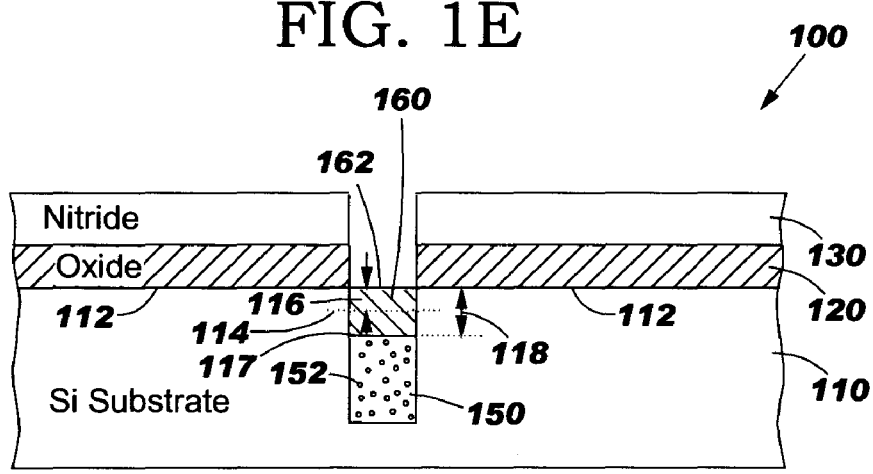

Next, with reference to FIG. 1E, in one embodiment, the electrically insulating cap region 160 is formed on top of the bubble-implanted semiconductor region 150. In one embodiment, if the bubble-implanted semiconductor region 150 comprises gas bubbles 152 surrounded by a silicon material, then the electrically insulating cap region 160 can be formed by thermally oxidizing a top surface 114 (FIG. 1D) of the bubble-implanted semiconductor region 150. As a result, a top surface 162 of the resulting electrically insulating cap region 160 grows upward from the original surface 114 (FIG. 1D). The electrically insulating cap region 160 also expands downward from the original surface 114 to a bottom surface 117, which is also the new top surface 117 of the bubble-implanted semiconductor region 150. The resulting regions 150 and 160 can be collectively referred to as the electric isolation region 150,160.

In one embodiment, the depth 116 (FIG. 1C) is such that when the thickness 118 of the electrically insulating cap region 160 is grown to the pre-specified thickness, the top surface 162 of the electrically insulating cap region 160 is at the same level as the top surface 112 of the substrate 110.

Figure 1F:
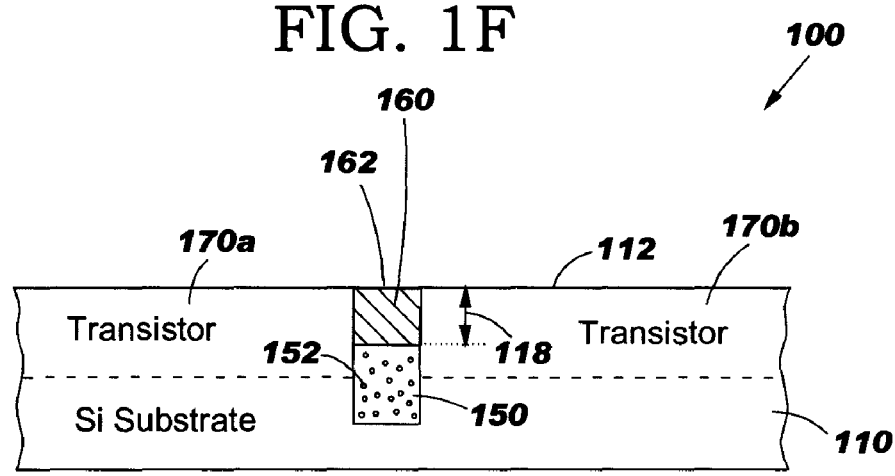

Next, with reference to FIG. 1F, in one embodiment, the hard mask layer 120,130 (FIG. 1E) can be stripped off by, illustratively, wet etching. Alternatively, the hard mask layer 120,130 (FIG. 1E) can be stripped by chemical mechanical polishing (CVD). Then, in one embodiment, two transistors 170a and 170b can be formed on two opposing sides of the electric isolation region 150,160 in and at top of the substrate 110. As a result, the electric isolation region 150,160 can serve to electrically isolate the transistors 170a and 170b.

In summary, multiple isolation structures like the electric isolation region 150,160 can be formed in a same substrate to electrically isolate different devices (e.g., transistors, resistors, capacitors, etc.) of an IC. In one embodiment, the thickness 118 of the electrically insulating cap region 160 can be relatively small (100–300 Å) compared with the thickness of an oxide layer of a typical STI layer which is usually 1,5000 Å thick. As a result, the formation of the electric isolation region 150,160 takes less time and therefore costs less than that of the prior art.

In addition, as a result of the top surface 162 of the electrically insulating cap region 160 being at the same level as the top surface 112 of the substrate 110, the resulting structure 100 of FIG. 1F has a planar top surface 112,116 which is beneficial for ensuing fabrication steps of forming devices and interconnect levels (not shown) in and on top of the substrate 110.

In one embodiment, with reference back to FIG. 1D, the implanting gas used for gas implanting step 155 can further comprise oxygen. As a result, the resulting gas bubbles 152 in the bubble-implanted semiconductor region 150 comprise oxygen. If the structure 100 is later heated (for instance, during the formation of the electrically insulating cap region 160 by thermal oxidation as shown in FIG. 1E), the oxygen in the gas bubbles 152 reacts with surrounding silicon material to form silicon dioxide at the edges of the gas bubbles 152. As a result, the gas bubbles 152 are now enclosed in silicon dioxide covers (not shown) and therefore essentially do not further increase in size when subjected to high temperatures.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An isolation structure, comprising:
   (a) a semiconductor substrate; and
   (b) an electric isolation region embedded in the semiconductor substrate, wherein the electric isolation region comprises (i) a bubble-implanted semiconductor region and (ii) an electrically insulating cap region on top of the bubble-implanted semiconductor region.

2. The isolation structure of claim 1, wherein a top surface of the electrically insulating cap region is essentially at a same level as a top surface of the substrate.

3. The isolation structure of claim 1, wherein the bubble-implanted semiconductor region comprises gas bubbles implanted in a semiconductor material, and wherein the gas bubbles comprise a noble gas.

4. The isolation structure of claim 3, wherein the gas bubbles further comprise an oxide material at their edges.

5. The isolation structure of claim 4, wherein the oxide material comprises silicon dioxide.

6. The isolation structure of claim 1, wherein the electrically insulating cap region comprises silicon dioxide.

7. A method for forming an isolation structure, the method comprising the steps of:
   (a) providing a semiconductor substrate;
   (b) implanting gas bubbles into a semiconductor region of the substrate so as to form a bubble-implanted semiconductor region in the substrate; and
   (c) forming an electrically insulating cap region on top of the bubble-implanted semiconductor region.

8. The method of claim 7, further comprising the stop of, after the step (b) is performed but before the step (c) is performed, subjecting the bubble-implanted semiconductor region to a heat cycle such that sizes of the implanted gas bubbles in the bubble-implanted semiconductor region will reach a pre-specified average size after the heat cycle and other ensuing heat fabrication steps.

9. The method of claim 7, wherein the step of implanting the gas bubbles comprises the steps of:
   forming a hard mask layer on top of the semiconductor substrate;
   creating an opening in the hard mask layer such that the substrate is exposed to the atmosphere via the opening; and
   implanting the gas bubbles into the semiconductor region of the substrate via the opening so as to form the bubble-implanted semiconductor region.

10. The method of claim 9, further comprising the step of stripping the hard mask layer after the step of forming the electrically insulating cap region.

11. The method of claim 10, wherein the step of stripping the hard mask layer comprises the use of chemical mechanical polishing.

12. The method of claim 7, further comprising the step of, after step (a) is performed but before step (b) is performed, etching into the substrate where the gas bubbles are to be implanted such that when the electrically insulating cap region having a pre-specified thickness is formed as a result of the step (c), a top surface of the electrically insulating cap region is essentially at a same level as a top surface of the substrate.

13. The method of claim 12, wherein the step of forming the electrically insulating cap region is performed such that the top surface of the electrically insulating cap region is essentially at the same level as the top surface or the substrate.

14. The method of claim 7, wherein the step of implanting the gas bubbles involves the use or an implanting gas which comprises a noble gas.

15. The method of claim 14,
wherein the implanting gas further comprises oxygen such that the resulting gas bubbles in the bubble-implanted semiconductor region comprise oxygen, and
wherein the step of forming the electrically insulating cap region comprises the step of subjecting the entire isolation structure to a temperature level such that the oxygen in the gas bubbles in the bubble-implanted semiconductor region reacts with a semiconductor material of the substrate to form a material which essentially prevents the gas bubbles from increasing in size under the temperature level.

16. The method of claim 7, wherein the step of forming the electrically insulating cup region comprises the step of thermally oxidizing a top surface of the bubble-implanted semiconductor region.

17. The method of claim 16, wherein the step of thermally oxidizing the top surface of the bubble-implanted semiconductor region is performed until a top surface of the resulting electrically insulating cap region is essentially at a same level as a top surface of the substrate.

18. The method of claim 7, wherein the gas bubbles comprise a noble gas.

19. The method of claim 7, wherein the electrically insulating cap region comprises silicon dioxide.

20. A method for forming an isolation structure, the method comprising the steps of:
(a) providing a semiconductor substrate;
(b) forming a hard mask layer on top of the semiconductor substrate;
(c) creating an opening in the hard mask layer such that a top surface of the substrate is exposed to the atmosphere via the opening;
(d) etching into the substrate via the opening;
(e) implanting gas bubbles into a semiconductor region of the substrate via the opening so as to form a bubble-implanted semiconductor region in the substrate; and
(f) forming an electrically insulating cap region on top of the bubble-implanted semiconductor region such that a top surface of the electrically insulating cap region is essentially at a same level as a top surface of the substrate.

* * * * *

UNITED STATES PATENT AND TRADEMARK OFFICE
CERTIFICATE OF CORRECTION

PATENT NO. : 7,012,316 B1 Page 1 of 1
APPLICATION NO. : 10/711425
DATED : March 14, 2006
INVENTOR(S) : Anderson et al.

It is certified that error appears in the above-identified patent and that said Letters Patent is hereby corrected as shown below:

<u>Column 4</u>
Line 50, delete "stop" and insert -- step --

<u>Column 5</u>
Line 18 and line 21, delete "or" and insert -- of --

<u>Column 6</u>
Line 2, delete "cup" and insert -- cap --

Signed and Sealed this

Eighth Day of August, 2006

JON W. DUDAS
*Director of the United States Patent and Trademark Office*